United States Patent
Chen et al.

(10) Patent No.: US 12,109,587 B2
(45) Date of Patent: Oct. 8, 2024

(54) POLYMER PLASTIC FRONT PLATE AND METHOD FOR MANUFACTURING THE SAME

(71) Applicant: ENFLEX CORPORATION, Taoyuan (TW)

(72) Inventors: Hsin Yuan Chen, Taoyuan (TW); Chun Kai Wang, Taoyuan (TW); Yu Ling Chien, Taoyuan (TW)

(73) Assignee: ENFLEX CORPORATION, Taoyuan (TW)

( * ) Notice: Subject to any disclaimer, the term of this patent is extended or adjusted under 35 U.S.C. 154(b) by 0 days.

(21) Appl. No.: 18/381,053

(22) Filed: Oct. 17, 2023

(65) Prior Publication Data

US 2024/0050984 A1 Feb. 15, 2024

Related U.S. Application Data

(63) Continuation of application No. 16/734,327, filed on Jan. 4, 2020, now abandoned.

(51) Int. Cl.
| | |
|---|---|
| *B05D 7/00* | (2006.01) |
| *B05D 7/04* | (2006.01) |
| *C08J 5/18* | (2006.01) |
| *C08J 7/04* | (2020.01) |
| *C09D 7/40* | (2018.01) |
| *C09D 7/61* | (2018.01) |
| *C09D 175/04* | (2006.01) |
| *H05K 1/03* | (2006.01) |
| *H05K 3/28* | (2006.01) |

(52) U.S. Cl.
CPC .............. *B05D 7/04* (2013.01); *C08J 5/18* (2013.01); *C08J 7/042* (2013.01); *C09D 7/61* (2018.01); *C09D 7/70* (2018.01); *C09D 175/04* (2013.01); *H05K 1/0313* (2013.01); *H05K 3/28* (2013.01); *H05K 3/284* (2013.01); *C08J 2333/12* (2013.01); *C08J 2369/00* (2013.01); *C08J 2475/04* (2013.01)

(58) Field of Classification Search
CPC .............. B05D 7/00; H05K 1/00; H05K 3/00
See application file for complete search history.

(56) References Cited

U.S. PATENT DOCUMENTS

2008/0053489 A1* 3/2008 Mizota .............. H01L 21/02052
134/33

* cited by examiner

*Primary Examiner* — Kelly M Gambetta
*Assistant Examiner* — Mohammad Mayy

(57) ABSTRACT

A polymer plastic front plate comprises: a plastic substrate and a hard coating layer formed on an adhesion surface of the plastic substrate. The hard coating layer comprises: organic-inorganic hybrid UV oligomer, high Tg UV resin additive, a plurality of dispersed flaky nano inorganic material, and photo initiator, so as to form a gas barrier hard coating layer with high surface dyne value (>44 dyne) on the adhesion surface of the plastic substrate. It not only has good ink printability and OCA adhesiveness, but also inhibits the diffusion of fugitive gas from polymer plastic front plates during high-temperature, high-temperature and high-humidity, high-low temperature thermal shocks and other harsh automotive industry environmental tests. The gas can be avoided from entering the OCA layer, thereby solving the problems of bubbles and delamination after the environmental tests are performed.

10 Claims, 7 Drawing Sheets

POLYMER PLASTIC FRONT PLATE AND METHOD FOR MANUFACTURING THE SAME

BACKGROUND OF INVENTION

1. Field of the Invention

The invention refers to a polymer plastic front plate and a method for manufacturing the same, especially refers to a polymer plastic front plate which is suitable for bonding on the surface of automotive touch panels.

2. Description of the Prior Art

Generally speaking, a touch panel on a touch-sensitive electronic device for a car is usually fitted with a front panel, not only because the front panel can protect the touch panel from scratches, but also because the front panel can also be printed with specific patterns or text for marking a specific touch area on the touch panel so as to improve the convenience of the user to operate the touch panel.

Please refer to FIG. 1, which is a schematic diagram of a typical example of a conventional technology, in which a front panel is attached to the front surface of a touch panel. The front panel 10 currently used for laminating on a touch panel is usually composed of a polymer plastic material, which comprises a plastic substrate 11 primary made of polymethyl methacrylate (PMMA) or polycarbonate (PC), a protective layer 12 disposed on an operation surface (outer surface) of the plastic substrate 11, and a hard coating layer 13 disposed on a bonding surface (inner surface) of the plastic substrate 11. The protective layer 12 and the hard coating layer 13 are applied to two different surfaces of the plastic substrate 11 by a hard coating (HC) technology. Currently, common HC materials include UV-curable multifunctional high surface tension oligomers (Oligomer) or high surface tension monomer formulations, which can be formed as a thin film on the surface of the plastic substrate 11 for increasing the hardness thereof, so as to provide a scratch-resistant effect. HC technology is mainly used on the surface of soft substrates, such as PC or PMMA plastic substrates 11. These kinds of plastic substrate 11 are relatively soft. After the surface is hardened by hard coating, the hardness can be as hard as glass, which is easy to be wiped clean and uneasy to be scratched. In addition, an ink layer 21 of a specific pattern or text can be printed on the surface of the hard coating layer 13 formed on the bonding surface of the plastic substrate 11 by means of ink printing; after that, an optical clear adhesive 22 (OCA) is applied to the hard coating layer 13 formed on the bonding surface of the plastic substrate 11, and then the front panel 10 is attached to the touch panel 23, letting the hard coating layer 13 and the ink layer 21 to be sandwiched between the plastic substrate 11 and the touch panel 23 and are adhesively bonded by the optical clear adhesive 22.

The composition of HC materials of the hard coating layer 13 formed on the bonding surface of the conventional plastic substrate 11 is a highly cross-linked ultraviolet light curing typed (UV-curable) resin formulation, for example, a multifunctional high surface tension oligomer formulation or a high surface tension monomer formulation. The highly cross-linked UV-curable resin formulation is coated on the OCA bonding surface of PC or PMMA plastic substrate 11, which not only can provide ink-printability and scratch resistance abilities to the bonding surface of the plastic substrate 11, but also can avoid surface damage caused by ink printing process. Although the composition of HC materials of the hard coating layer 13 of the conventional plastic substrate 11 has a high surface dyne value (>38 dyne), which is capable of ink printing and suitable for optical clear adhesive 22 (OCA) bonding, and has good adhesion with the optical clear adhesive 22 (OCA); however, because the ordinary multifunctional high surface tension oligomer and high surface tension monomer formula are not effective in blocking gas diffusion, therefore, it is still impossible to pass the environmental tests of harsh high-temperature, high-temperature and high-humidity, and high-low temperature (hot and cold) thermal shocks for the front panel 10 of the touch panel of vehicle electronic device in the automotive industry. Thus, the front panel 10 will suffer problems such as outgassing, delay bubbles caused by moisture intrusion, and delamination after the environmental tests.

In the embodiments described below, since most of the elements are the same or similar to the typical example shown in FIG. 1, the same or similar elements will be given with the same name and numeral directly, and will not be described in detail.

Please refer to FIG. 2, which is a schematic diagram of another typical example of a conventional front panel. In order to improve the effect for blocking the diffusion of gas, one approach is to additionally provide a "single-layer" continuous gas barrier layer 14 on the hard coating layer 13 formed on the bonding surface of the front panel 10a. The material of the single-layer continuous gas barrier layer 14 can be an air-impermeable material such as alumina, and is completely covering the entire surface of the hard coating layer 13. The advantage of this approach is that the continuity of the gas barrier layer 14 and the optical clear adhesive 22 (OCA) is good, and the initial gas barrier effect is excellent. However, since the continuous gas barrier layer 14 is subjected to the environmental tests with high-low temperature (hot and cold) thermal shocks, many micro or nano cracks will be generated, and thus, the gas barrier effect becomes poor after the environmental tests; in addition, the continuous gas barrier layer 14 must be formed by using vacuum coating process, the costs is high, and the production efficiency is low; furthermore, the printability of ink of the continuous gas barrier layer 14 is poor (poor adhesion between the inorganic layer material and the ink); therefore, such approach is not a good solution.

Please refer to FIG. 3, which is a schematic diagram of a further typical example of a conventional front panel. Another approach of the prior art is to add a plurality of dispersed spherical nano gas barrier particles 212 into the hard coating layer 210 formed on the bonding surface of the front panel 20. These spherical nano gas barrier particles 212 can be made of air-impermeable material such as alumina, and are discontinuously dispersed in the highly cross-linked UV-curable resin material 211 included in the entire hard coating layer 210, in order to form a discontinuous gas barrier structure in the hard layer 210. The advantages of this approach are that the adhesion between the hard coating layer 210 and the optical clear adhesive (OCA) is good, and the printability of ink is also good; in addition, the material of spherical nano gas barrier particles 212 is also easy to get. However, because the gas barrier structure included in the hard coating layer 210 is discontinuous, there are many gaps between these spherical nano gas barrier particles 212, therefore the initial gas barrier effect for blocking the gas diffusion is not good, and the effect for blocking the gas diffusion after the environmental test is also poor, and thus leaves a room for further improvements.

SUMMARY OF THE INVENTION

The primary objective of the invention is to provide a polymer plastic front plate suitable for bonding on the surface of automotive touch panels, which can form a gas barrier hard coating layer with high surface dyne value (>44 dyne) on the adhesion surface of the plastic substrate. It not only has good ink printability and OCA adhesiveness, but also inhibits the diffusion of fugitive gas from polymer plastic front plates during high-temperature, high-temperature and high-humidity, high-low temperature (hot and cold) thermal shocks and other harsh automotive industry environmental tests. The gas can be avoided from entering the OCA layer, thereby solving the problems of bubbles and delamination after the environmental tests are performed.

Another objective of the invention is to provide a method for manufacturing a polymer plastic front plate suitable for bonding on the surface of automotive touch panels, which can apply a hard coating layer on the bonding surface of the plastic substrate by using a hard coating (HC) technology. Wherein, the hard coating layer contains a plurality of dispersed nano-scale flaky inorganic substances arranged in a randomly distributed horizontal direction in the hard coating layer, so as to form a discontinuously layered dispersed gas barrier layer in the hard coating layer. Not only can provide good gas barrier effect but also can prevent cracks from happening.

In order to achieve the aforementioned objectives, the invention provides a polymer plastic front plate which comprises: a plastic substrate having an operation surface and a bonding surface, a protective layer furnished on the operation surface, and a hard coating layer furnished on the bonding surface; wherein the hard coating layer comprises: a first weight percentage of organic-inorganic hybrid UV-curable oligomer, a second weight percentage of UV-curable resin additives with high glass transition temperature (Tg) value, a plurality of dispersed nano-scale flaky inorganic substances, and a photo initiator; wherein, the plurality of dispersed nano-scale flaky inorganic substances are arranged in a randomly distributed horizontal direction in the hard coating layer to form a discontinuously layered dispersed gas barrier layer in the hard coating layer.

In a preferred embodiment, the organic-inorganic hybrid UV-curable oligomer includes a polyurethane resin and a sol-gel silica hybrid mixture.

In a preferred embodiment, the glass transition temperature (Tg) value of the UV-curable resin additives is not less than 120° C.; in addition, the UV-curable resin additives contain at least one of the following: UV-curable oligomer with high glass transition temperature (high Tg UV oligomer) and UV-curable monomer with high glass transition temperature (high Tg UV monomer).

In a preferred embodiment, the UV-curable oligomer with high glass transition temperature is polyurethane acrylate, which has a glass transition temperature (Tg) value not less than 120° C.; in addition, the UV-curable monomer with high glass transition temperature is Tris(2-hydroxy ethyl) isocyanuratetriacrylate (THEICTA), which has a glass transition temperature (Tg) value not less than 240° C.

In a preferred embodiment, the nano-scale flaky inorganic substances are composed of at least one of the following materials: $SiO_2$, $Al_2O_3$, $Si_3N_4$, $SiO_xN_y$, and $AlO_xN_y$.

In a preferred embodiment, each of the nano-scale flaky inorganic substances has a thickness (t), a longitudinal width (w1) and a lateral width (w2); wherein, the measuring directions of the thickness (t), the longitudinal width (w1) and the lateral width (w2) are perpendicular to each other, and w1≥w2≥t; wherein, the thickness (t) is between 0.1 nm and 50 nm, the longitudinal width (w1) is between 100 nm and 1000 nm, and the ratio of the lateral width to the longitudinal width (w2/w1) is between 0.01 and 1.

In a preferred embodiment, 10 nm≤t≤30 nm, 300 nm≤w1≤800 nm, and 0.1≤(w2/w1)≤1.

In a preferred embodiment, the value of the first weight percentage is ranged between 50% and 70%, the value of the second weight percentage is ranged between 30% and 50%, and the value of the weight percentage of the nano-scale flaky inorganic substances in the hard coating layer is between 5% and 15%.

In a preferred embodiment, the plastic substrate is one of the following: polymethyl methacrylate (PMMA) plate, polycarbonate (PC) plate, PMMA/PC double-layer composite plate, and PMMA/PC/PMMA three-layer composite plate; in addition, the surface of the hard coating layer can be applied with an ink layer and an optical clear adhesive (OCA) layer for attaching to the surface of the touch panel.

In order to achieve the aforementioned objectives, the invention provides a method for manufacturing a polymer plastic front plate, comprising: Step (A): providing a plastic substrate and a coating material; the plastic substrate having a bonding surface; said coating material including: a first weight percentage of organic-inorganic hybrid UV-curable oligomer, a second weight percentage of UV-curable resin additives with high glass transition temperature (Tg) value, a plurality of dispersed nano-scale flaky inorganic substances, and a photo initiator; Step (B): applying the coating material onto the bonding surface of the plastic substrate; and Step (C): curing the coating material to form a hard coating layer on the bonding surface of the plastic substrate; wherein, during the curing process, the plurality of dispersed nano-scale flaky inorganic substances will be affected by the gravity and hydrodynamics, and randomly dispersed and arranged along a horizontal direction in a parallel manner within the hard coating layer, such that the plurality of dispersed nano-scale flaky inorganic substances can form a discontinuously layered dispersed gas barrier layer in the hard coating layer.

In a preferred embodiment, the process for providing the coating material described in Step (A) comprises the following steps: Step (A1): forming an inorganic layer on a carrier plate; Step (A2): detaching and breaking the inorganic layer into a plurality of tiny inorganic fragments; Step (A3): smoothing and dispersing the plurality of tiny inorganic fragments in order to transform the plurality of tiny inorganic fragments into the plurality of dispersed nano-scale flaky inorganic substances; and Step (A4): adding and mixing the plurality of dispersed nano-scale flaky inorganic substances into a solution of the organic-inorganic hybrid UV-curable oligomer, the UV-curable resin additive and the photo initiator to form the coating material.

In a preferred embodiment, in Step (A1), the carrier plate is a glass carrier plate, and a release film is provided on a surface of the glass carrier plate; an inorganic material is plated on the release film by a vacuum sputtering process in order to form a whole piece of the inorganic layer on the surface of the release film; in Step (A2), the inorganic layer is broken by shaking, vibrating or striking the carrier plate, such that the broken inorganic layer can be detached from the release film of the carrier plate and be broken into the plurality of tiny inorganic fragments; in Step (A3), the plurality of tiny inorganic fragments are mixed and stirred by a nano dispersion equipment, so that the plurality of tiny inorganic fragments can collide with each other to gradually smooth their sharp edges and also disperse them evenly and individually, so as to form the plurality of dispersed nano-scale flaky inorganic substances.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The polymer plastic front plate of the invention is suitable for bonding on the surface of automotive touch panels. By means of the addition of organic-inorganic high Glass Transition Temperature (Tg) UV oligomers and nano-scale flake-like inorganic oxides, a gas barrier hard coating layer with high surface dyne value (>44 dyne) can be formed on the adhesion surface of the plastic substrate. It not only has good ink printability and OCA adhesiveness, but also inhibits the diffusion of fugitive gas from polymer plastic front plates during high-temperature, high-temperature and high-humidity, high-low temperature (hot and cold) thermal shocks and other harsh automotive industry environmental tests, which is due to the fact that these nano-scale flaky inorganic oxides can form a discontinuously layered dispersed gas barrier layer in the hard coating layer. The gas can be avoided from entering the OCA layer, thereby solving the problems of bubbles and delamination after the environmental tests are performed.

In order to more clearly describe the structure of the polymer plastic front plate and method for manufacturing the same, detailed descriptions will be provided below with reference to the drawings.

Figure 4:
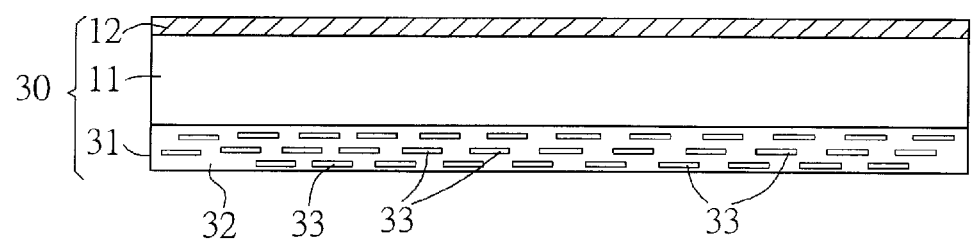
FIG. 4 is a schematic diagram of a preferred embodiment of a polymer plastic front panel suitable for a sunroof of vehicle according to the present invention.

Please refer to FIG. 4, which is a schematic diagram of a preferred embodiment of a polymer plastic front panel suitable for a sunroof of vehicle according to the present invention. The polymer plastic front panel 30 of the present invention can be bonded on a touch panel (not shown in the figure) of a touch-sensitive typed electronic device for a vehicle by using optical clear adhesive (not shown in the figure), which comprises: a plastic substrate 11, a protective layer 12 and a hard coating layer 31. The polymer plastic front panel 30 of the present invention can be made into a polymer plastic sheet with high hardness, high wear resistance, high impact resistance, high flexibility, and extremely low gas transmission rate, or be used to replace traditional tempered glass as the cover material of touch panel, which is particularly suitable for cover materials of automotive touch panels in order to meet the harsh high-temperature or high-temperature high-humidity environmental testing specifications.

In in embodiment, the plastic substrate 11 is one of the following: polymethyl methacrylate (PMMA) plate, polycarbonate (PC) plate, PMMA/PC double-layer composite plate, PMMA/PC/PMMA three-layer composite plate, or other kind of single-layer or multi-layer co-extruded plate made of polymer materials. When the plastic substrate is a multilayer plate, polycarbonate (PC) can be used as the material of the main-layer with a thickness accounting for 60%-99.99% of the total thickness of the plastic substrate. In the other hand, each of the sub-layers located on either one side or two opposite (outer and inner) sides of the main-layer may have a thickness accounting for 0.01%-40% of the total thickness of the plastic substrate, and the material of the sub-layer may be chosen from one of the following: PMMA, Modified PMMA, Modified PC, PMMI, PET, PEN, PES, PI, and etc. . . . The plastic substrate 11 has a corresponding operation surface (outer surface) and a bonding surface (inner surface); in which, the side of the operation surface is for the user to touch and operate the touch panel, while the side of the bonding surface is for printing an ink layer and for applying an optical clear adhesive in order to bond to the touch panel. The protective layer 12 is furnished on the operation surface (outer surface) of the plastic substrate 11, while the hard coating layer 31 is furnished on the bonding surface (inner surface) of the plastic substrate 11. The protective layer 12 and the hard coating layer 31 are respectively applied to the operation surface (outer surface) and the bonding surface (inner surface) of the plastic substrate 11 by a hard coating (HC) technology. As shown in FIG. 4, the surface of the hard coating layer 31 of the invention can also be applied with both an ink layer and an optical clear adhesive (OCA) layer for attaching to the surface of the touch panel. In this embodiment, the thickness of the plastic substrate 11 is between 100 μm and 1000 μm.

In the present invention, the thickness of the hard coating layer 31 can be between 0.1 μm and 100 μm, and is better between 1 μm and 50 μm, and is best between 5 μm and 30 μm. In this embodiment, the hard coating layer 31 is composed of a mixture of: a coating material 32, a plurality of dispersed nano-scale flaky inorganic substances 33, and a photo initiator; wherein, the resin formulation of the coating material 32 includes a first weight percentage of organic-inorganic hybrid UV-curable oligomer, and a second weight percentage of UV-curable resin additives with high glass transition temperature (Tg) value. In addition, the plurality of dispersed nano-scale flaky inorganic substances 33 are arranged in a randomly distributed horizontal direction in the coating material 32 of the hard coating layer 31, so as to form a discontinuously layered dispersed gas barrier layer in the hard coating layer 31. These randomly and horizontally distributed nano-scale flaky inorganic substances 33 not only can provide good gas barrier effect but also can prevent cracks from happening in the hard coating layer 31. In this embodiment, the organic-inorganic hybrid UV-curable oligomer includes a polyurethane resin and a sol-gel silica hybrid mixture. The glass transition temperature (Tg) value of the UV-curable resin additives is not less than 120° C.; in addition, the UV-curable resin additives contain at least one of the following: UV-curable oligomer with high glass transition temperature (high Tg UV oligomer) and/or UV-curable monomer with high glass transition temperature (high Tg UV monomer). In a preferred embodiment of the invention, the UV-curable oligomer with high glass transition temperature is polyurethane acrylate, which has a glass transition temperature (Tg) value not less than 120° C. The UV-curable monomer with high glass transition temperature is Tris(2-hydroxy ethyl) isocyanuratetriacrylate (THEICTA), which has a glass transition temperature (Tg) value not less than 240° C. The nano-scale flaky inorganic substances 33 are composed of at least one of the following materials: $SiO_2$, $Al_2O_3$, $Si_3N_4$, $SiO_xN_y$, and/or $AlO_xN_y$. In this embodiment, the value of the first weight percentage is ranged between 50% and 70%, the value of the second weight percentage is ranged between 30% and 50%, and the value of the weight percentage of the nano-scale flaky inorganic substances 33 in the hard coating layer is between 5% and 15%.

The organic-inorganic hybrid UV oligomer contained in the hard coating layer 31 can provide the optical clear adhesive (OCA) bonding surface of the polymer plastic front panel 30 with high hardness and high wear resistance. In addition, the high Tg UV oligomer (≥120° C.) and/or high Tg UV monomer (≥240° C.) contained in the hard coating layer 31 can provide the optical clear adhesive (OCA) bonding surface of the polymer plastic front panel 30 with high impact resistance, high flexibility, and stability at high temperatures, which can reduce the air chamber space during the high-temperature and high-humidity environmental tests, reduce polymer pores, and thus reduce gas permeability. The reason why the polymer plastic front panel 30 of the present invention contains a material with a high Tg (above 120° C.) is that, when the temperature of working environment of the polymer plastic front panel 30 is close to the Tg point (glass transition temperature) of the polymer material, the porosity of the polymer material will increase, which will cause water vapor to enter. The highest testing temperature of the environmental tests for vehicles is 90° C. If the Tg of the material is lower than or close to 90° C., when the working temperature of 90° C. is reached, the polymer segment will soften and the porosity will increase, which will cause water vapor to penetrate more easily and fail to provide the effect of blocking water vapor. This problem can be avoided as long as the Tg of the resin formulation material contained in the coating material 32 of the hard coating layer 31 is 120° C. or above. Moreover, the randomly and horizontally distributed nano-scale flaky inorganic substances 33 contained in the coating material 32 of the hard coating layer 31 can provide the polymer plastic front panel 30 with a very low gas transmission rate, and can also maintain high transparency and low haze. Because these nano-scale flaky inorganic substances 33 can form a discontinuously layered dispersed gas barrier layer in the hard coating layer 31, which inhibits the diffusion of fugitive gas from the polymer plastic front plate during the high-temperature, high-temperature and high-humidity, high-low temperature (hot and cold) thermal shocks and other harsh automotive industry environmental tests, prevents the gas from entering the OCA layer, solves the problems of bubbles and delamination after the environmental tests, and thereby indeed effectively improves the various shortcomings of the aforementioned conventional techniques.

Figure 5:
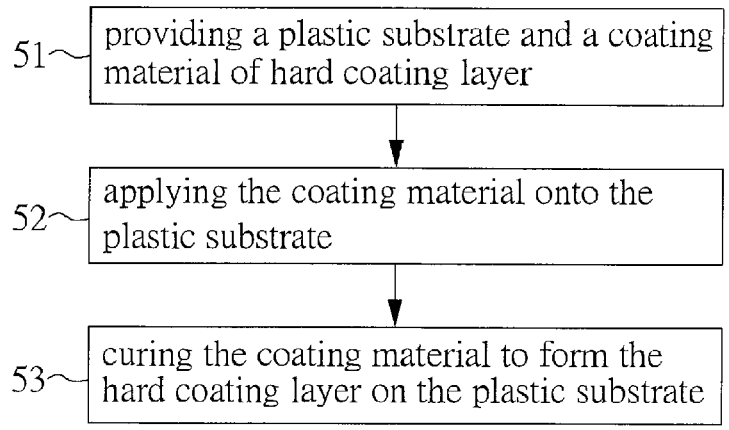
FIG. 5 is a flow chart showing an embodiment of the method for manufacturing the polymer plastic front plate in accordance with the invention.
Figure 6:
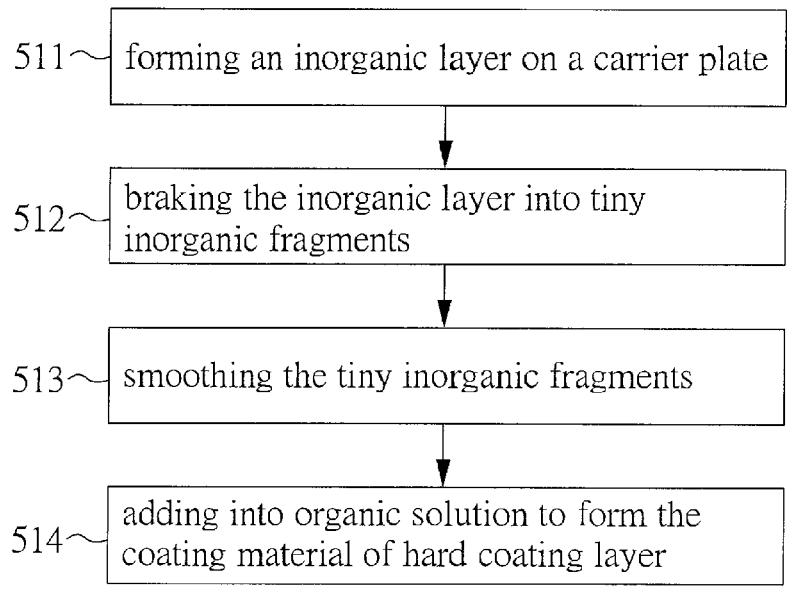
FIG. 6 is a flowchart of an embodiment of the process for providing the coating material of the hard coating layer in accordance with the method for manufacturing the polymer plastic front panel of the present invention.

Please refer to FIG. 5, which is a flow chart showing an embodiment of the method for manufacturing the polymer plastic front plate in accordance with the invention. The method for manufacturing the polymer plastic front plate of the invention comprises the following steps.

Step 51: providing a plastic substrate and a coating material of hard coating layer. Like the embodiment shown in FIG. 4, the plastic substrate of the polymer plastic front plate of the invention has a bonding surface and an operation surface. The coating material of the hard coating layer is a paint-like liquid mixture including: a first weight percentage of organic-inorganic hybrid UV-curable oligomer, a second weight percentage of UV-curable resin additives with high glass transition temperature (Tg) value, a plurality of dispersed nano-scale flaky inorganic substances, a photo initiator, and volatile solvents. In one embodiment, a protective layer has been formed on the operation surface of the plastic substrate in advance before performing the following Step 52. However, in another embodiment, there is no protective layer being formed on the plastic substrate when performing the Step 52; in contrary, such protective layer is formed on the operation surface of the plastic substrate after the Step 52 has been completed.

Step 52: applying the paint-like liquid coating material of the hard coating layer onto the entire bonding surface of the plastic substrate by using a hard coating technology.

Step 53: curing the coating material to form the hard coating layer on the bonding surface of the plastic substrate. In the curing process, the volatile solvent contained in the coating material is volatilized by a baking or far-infrared (IR) irradiating process, and the organic-inorganic hybrid UV-curable oligomer and the UV-curable resin additive contained in the coating material is hardened by an irradiating process of ultraviolet (UV) light with a specific wavelength. Wherein, during the curing process, as the solvent slowly evaporates, the plurality of dispersed nano-scale flaky inorganic substances will be affected by the gravity and hydrodynamics, and thus randomly dispersed and arranged along a horizontal direction in a parallel manner within the hard coating layer, such that the plurality of dispersed nano-scale flaky inorganic substances can form a discontinuously layered dispersed gas barrier layer in the hard coating layer after the curing process is completed. Thereby, a hard coating layer including a discontinuously layered dispersed gas barrier layer composed of the plurality of dispersed nano-scale flaky inorganic substances can be formed on the bonding surface of the plastic substrate.

Please refer to FIG. 6 and FIGS. 7A to 7C, which respectively are the flowchart of an embodiment of the process for providing the coating material of the hard coating layer, and some schematic diagrams of several different steps thereof, in accordance with the method for manufacturing the polymer plastic front panel of the present invention. In the embodiment shown in FIG. 6, the process for providing the coating material of the hard coating layer comprises the following steps.

Figure 7A:
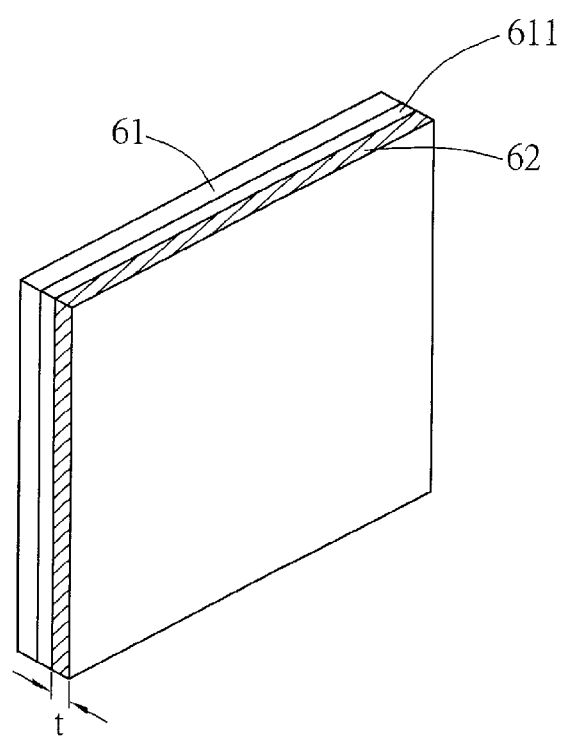
FIGS. 7A to 7C respectively are some schematic diagrams of several different steps of the flowchart shown in FIG. 6, in accordance with the method for manufacturing the polymer plastic front panel of the present invention.

Step 511: forming an inorganic layer 62 on a carrier plate 61. As shown in FIG. 7A, in a preferred embodiment of the invention, the carrier plate 61 is a glass carrier plate 61, and a release film 611 is provided on a surface of the glass carrier plate 61. An inorganic material is plated on the release film 611 by a vacuum sputtering process in order to form a whole piece of the inorganic layer 62 on the surface of the release film 611. Wherein, the material of the inorganic material comprises one of the following: silicon dioxide ($SiO_2$), aluminum oxide ($Al_2O_3$), silicon nitride ($Si_3N_4$), silicon oxynitride ($SiO_xN_y$), and aluminum oxynitride ($AlO_xN_y$). In this embodiment, the inorganic material is preferably made of aluminum oxide ($Al_2O_3$).

Figure 7B:
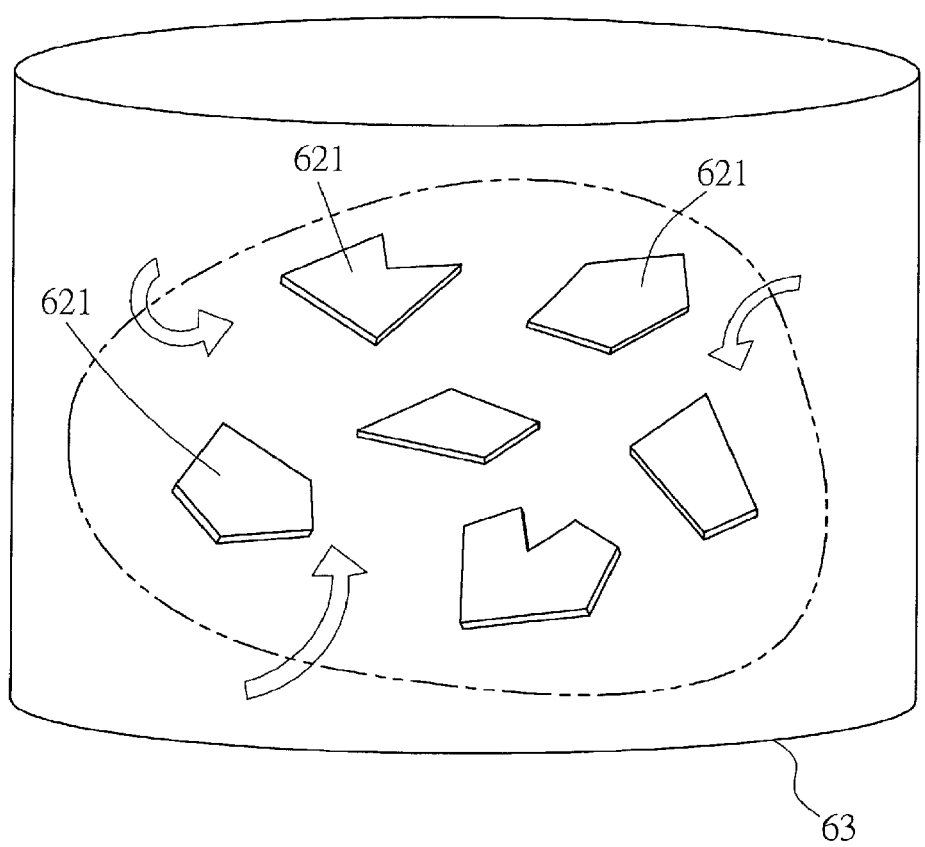

Step 512: detaching and breaking the inorganic layer 62 into a plurality of tiny inorganic fragments 621. As shown in FIG. 7B, the entire inorganic layer 62 is broken by shaking, vibrating or striking the carrier plate 61, such that the broken inorganic layer 62 can be detached from the release film 611 of the carrier plate 61, and the released inorganic layer 62 can be broken into the plurality of tiny inorganic fragments 621. In this step, the plurality of the tiny inorganic fragments 621 obtained are irregular in shape and have sharp edges, but the size of each tiny inorganic fragment 621 does not differ much.

Figure 7C:
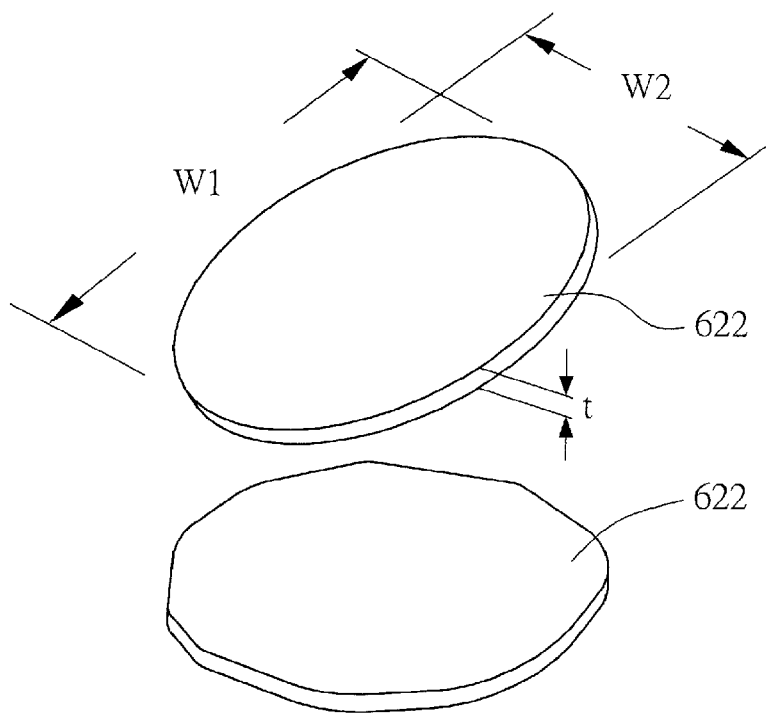

Step 513: smoothing and dispersing the plurality of tiny inorganic fragments 621 in order to transform the plurality of tiny inorganic fragments 621 into the plurality of dispersed nano-scale flaky inorganic substances 622. As shown in FIG. 7B, in this step, the plurality of tiny inorganic fragments 621 are mixed and stirred by a nano dispersion equipment 63, so that the plurality of tiny inorganic fragments 621 will collide with each other to gradually smooth their sharp edges and also disperse them evenly and individually, so as to form the plurality of dispersed nano-scale flaky inorganic substances 622. As shown in FIG. 7C, after the smoothing and dispersing process of the tiny inorganic fragments 621 described in Step 513 is completed, each of the nano-scale flaky inorganic substances 622 will have a thickness (t), a longitudinal width (w1) and a lateral width (w2); wherein, the measuring directions of the thickness (t), the longitudinal width (w1) and the lateral width (w2) are perpendicular to each other, and w1≥w2≥t. In which, the thickness (t) is between 0.1 nm and 50 nm, the longitudinal width (w1) is between 100 nm and 1000 nm, and the ratio of the lateral width to the longitudinal width (w2/w1) is between 0.01 and 1. In the present invention, a best effect can be achieved when 10 nm≤t≤30 nm, 300 nm≤w1≤800 nm, and 0.1≤(w2/w1)≤1.

Step 514: adding and mixing the plurality of dispersed nano-scale flaky inorganic substances 622 into the solution of organic-inorganic hybrid UV-curable oligomer, the UV-curable resin additive, the photo initiator, and the volatile solvent to form the coating material of the hard coating layer. In this embodiment, the organic-inorganic hybrid UV-curable oligomer comprises polyurethane resin and sol-gel silica hybrid mixture. The glass transition temperature (Tg) value of the UV-curable resin additive is not less than 120° C., in addition, the UV-curable resin additive comprises at least one of the following: high Tg UV-curable oligomer or high Tg UV-curable monomer. In a preferred embodiment of the invention, the high Tg UV-curable oligomer is polyurethane acrylate, which has a Tg value not less than 120° C. The high Tg UV-curable monomer is Tris(2-hydroxy ethyl) isocyanuratetriacrylate (THEICTA), which has a Tg value not less than 240° C. The weight percentage of the organic-inorganic hybrid UV oligomer in the coating material is ranged between 50% and 70%, the weight percentage of the high Tg UV-curable resin additive is ranged between 30% and 50%, the weight percentage of the nano-scale flaky inorganic substances in the coating material of the hard coating layer is between 5% and 15%, and the weight percentage of the photo initiator is about 5% or so.

Figure 8A:
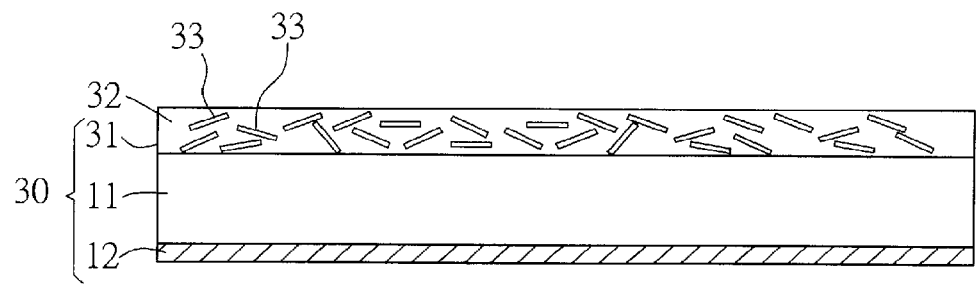
FIG. 8A to FIG. 8C respectively are the schematic diagrams of the hard coating layer at some different stages during the curing process of coating material in accordance with the manufacturing method of the polymer plastic front panel of the present invention.
Figure 8B:
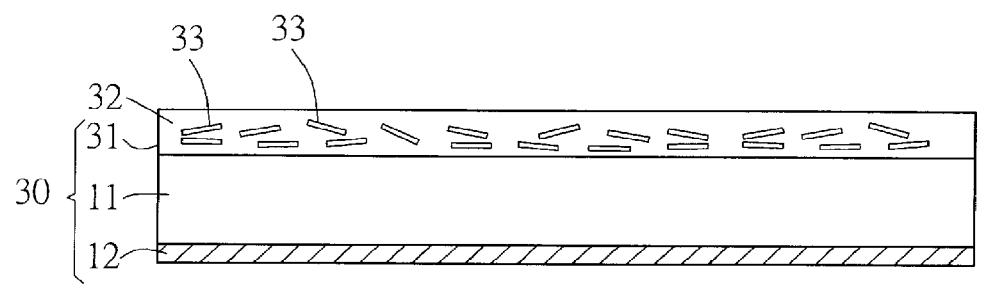
Figure 8C:
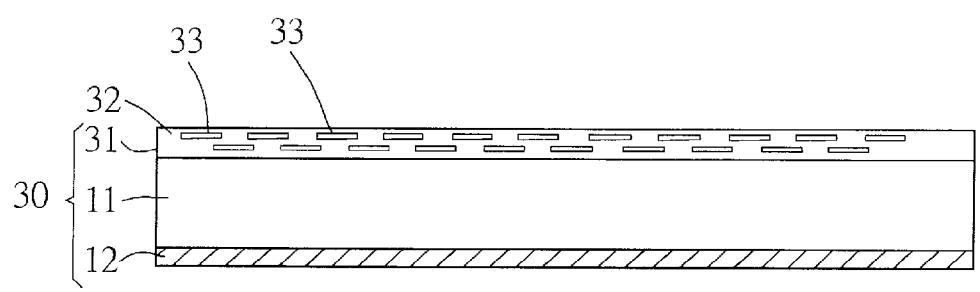

Please refer to FIG. 8A to FIG. 8C, which respectively are the schematic diagrams of the hard coating layer at some different stages during the curing process of coating material in accordance with the manufacturing method of the polymer plastic front panel of the present invention. After completing the Step 52 (shown in FIG. 6) of applying the liquid coating material 32 onto the entire bonding surface of the plastic substrate 11, the initial status of the plastic substrate 11 will be similar to the one shown in FIG. 8A that, the coating material 32 applied on the bonding surface of the plastic substrate 11 is still in a liquid state, and the thickness of the coating material 32 is relatively thick because the amount of the solvent contained in the coating material 32 is still large. At this stage, most of the dispersed nano-scale flaky inorganic substances 33 contained in the coating material 32 are in a non-directional randomly distributed status. Then, as shown in FIG. 8B, when the solvent contained in the coating material 32 is gradually evaporated by baking or far-infrared (IR) irradiating process, the coating material will gradually harden and the thickness will gradually decrease; therefore, the dispersed nano-scale flaky inorganic substances 33 contained in the coating material 32 will be affected by the gravity and hydrodynamics, and thus randomly dispersed and arranged along a horizontal direction in a parallel manner within the hard coating layer 31. At last, when the curing process is completed, as shown in FIG. 8C, the plurality of dispersed nano-scale flaky inorganic substances 33 will form a discontinuously layered dispersed gas barrier layer in the cured hard coating layer 31. Such kind of structure of the discontinuously layered dispersed gas barrier layer not only can provide a good gas barrier effect similar to the continuous gas barrier layer shown in FIG. 2 in a crack-free state because of its "layered" and "horizontally and parallel dispersed" nano-scale flaky inorganic substances 33; moreover, because these horizontally and parallel dispersed nano-scale flaky inorganic substances 33 are "discontinuously" layered and stacked, therefore, no cracks will occur in the hard coating layer 31 even after the high-temperature, high-temperature and high-humidity, high-low temperature (hot and cold) thermal shocks and other harsh automotive industry environmental tests are performed. As a result, the polymer plastic front plate 30 made by the manufacturing method of the invention described above can effectively reduce the diffusion of gas from polymer plastic plates, avoid spilled gas from entering the optical clear adhesive (OCA) layer, solve the problems of bubbles and delamination after the environmental tests are performed, and thereby indeed effectively improve the various shortcomings of the aforementioned conventional techniques.

The applicant has produced several samples of front panels based on the structures of either the conventional front panels or the invention shown in FIG. 1 to FIG. 4. Each sample of the front panel is composed of different resin formulations and solid ingredient ratios and is tested by using the same harsh regulations as the aforementioned automotive industry environmental tests. The results of tests are shown in the Table 1 and Table 2 below. Table 1 lists the information of the resin formulations and solid ingredient ratios of a total of twelve samples including sample numbers "Sample1" to "Sample11" and a "Comparative Sample". Table 2 lists a comparison table of the testing results and performances of these samples shown in Table 1 after conducting the environmental tests.

Figure 2:
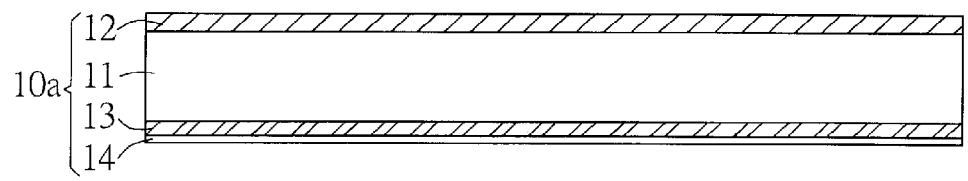
FIG. 2 is a schematic diagram of another typical example of a conventional front panel.

In the Table 1 below:
  the value in the composition column A indicates the weight percentage of the organic-inorganic hybrid UV-curable oligomer (including polyurethane resin and sol-gel silica hybrid mixture) contained in the coating material of the hard coating layer;

the value in the composition column B indicates the weight percentage of the High Tg UV-curable oligomer (e.g., Polyurethane acrylate or High Tg UV-curable monomer such as THEICTA) contained in the coating material of the hard coating layer;

the value in the composition column C indicates the weight percentage of the conventional Spherical Inorganic Nano Gas Barrier Particles (e.g., Spherical Nano $Al_2O_3$) contained in the coating material of the hard coating layer;

the value in the composition column D indicates the weight percentage of the Dispersed Nano-scale Flaky Inorganic Substances (e.g., Laminar Nano $Al_2O_3$) of the invention contained in the coating material of the hard coating layer;

the value in the composition column E indicates the weight percentage of the Photo Initiator contained in the coating material of the hard coating layer;

the "Comparative Sample" is a sample of front panel formed with a single continuous gas barrier layer on the bonding surface of plastic substrate by a vacuum sputtering process as which shown in FIG. 2.

It can be understood from Table 1 that, because the composition A and composition B are the primary materials for the hard coating layer, while the compositions C, D, and E are merely additives; therefore, in practice, when calculating the solid ingredient ratios contained in the resin formulation of the hard coating layer, the sum of the weight percentages of the composition A and the composition B (primary materials) should be equal to 100%, while the weight percentages of the compositions C, D, E are considered to be an additional amount of additives which is not calculated within the aforementioned 100%.

Figure 1:
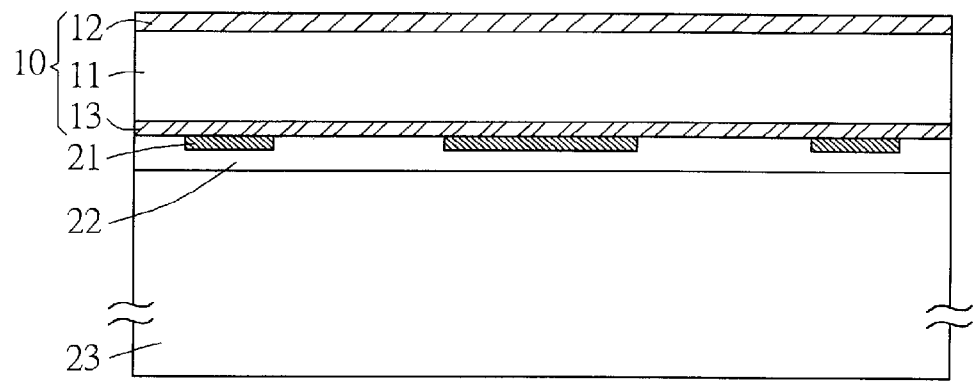
FIG. 1 is a schematic diagram of a typical example of a conventional front panel.
Figure 3:
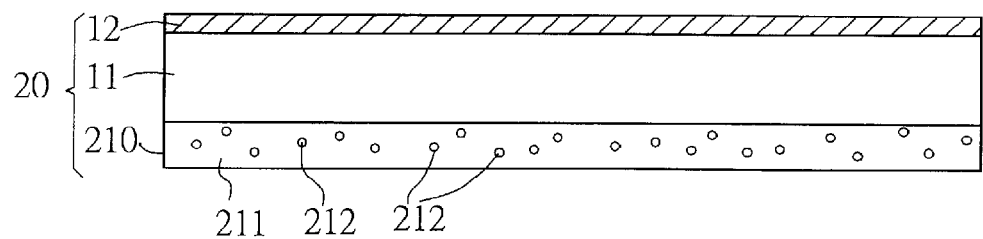
FIG. 3 is a schematic diagram of a further typical example of a conventional front panel.

It can be understood from Table 1 that, except for the "Comparative Sample" which is formed with a single continuous gas barrier layer on the bonding surface of plastic substrate by a vacuum sputtering process as which shown in FIG. 2; samples of "Sample 1" to "Sample 5" are without any gas blocking structure like the conventional technology shown in FIG. 1; samples of "Sample 6" to "Sample 8" are added with spherical inorganic nano gas barrier particles within the hard coating layer like the conventional technology shown in FIG. 3; and, samples of "Sample 9" to "Sample 11" are added with dispersed nano-scale flaky inorganic substances within the hard coating layer like the embodiment of the invention shown in FIG. 4.

TABLE 1 the information of the resin formulations and solid ingredient ratios of samples

| Sample No. | A | B | C | D | E | Remark |
|---|---|---|---|---|---|---|
| Sample1 | 100% | | — | | 5% | |
| Sample2 | 70% | 30% | | | 5% | |
| Sample3 | 60% | 40% | | | 5% | |
| Sample4 | 50% | 50% | | | 5% | |
| Sample5 | 40% | 60% | | | 5% | |
| Sample6 | 60% | 40% | 5% | — | 5% | |
| Sample7 | 60% | 40% | 10% | — | 5% | |
| Sample8 | 60% | 40% | 15% | — | 5% | |
| Sample9 | 60% | 40% | | 5% | 5% | |
| Sample10 | 60% | 40% | | 10% | 5% | |
| Sample11 | 60% | 40% | | 15% | 5% | |
| Comparative Sample | 100% | | | | 5% | vacuum sputtering continuous gas barrier |

TABLE 2 comparison of testing results and performances

| | | | Item Tested | | | | | | | | |
|---|---|---|---|---|---|---|---|---|---|---|---|
| Sample No. | Pencil Hardness | Impact resistance with falling ball (cm) 750 g | Substrate Adhesion Initial | Substrate Adhesion Water boiling/ 12 hrs | Ink adhesion | Wear resistance of surface | Flexibility test (R= 10 mm) | Free volume porosity Average radius R 95dB | OCA bonding- 40dC 1000 hrs environmental test | OCA bonding- 95dC 1000 hrs environmental test | OCA bonding- 85dC -5% RH 1000 hrs environmental test | OCA bonding- -40dC ← → 85dC 1000 hrs environmental test |
| Sample 1 | 6H | 30 | 5B | 5B | 5B | ◎ | X | 1.5 nm | Δ | X | X | X |
| Sample 2 | 5H | 60 | 5B | 5B | 5B | ◎ | ○ | 1.2 nm | ◎ | Δ | Δ | Δ |
| Sample 3 | 5H | 100 | 5B | 5B | 5B | ◎ | ◎ | 1.0 nm | ◎ | Δ | Δ | Δ |
| Sample 4 | 4H | 120 | 5B | 5B | 5B | ○ | ◎ | 1.0 nm | ◎ | Δ | Δ | Δ |
| Sample 5 | 4H | 130 | 5B | 5B | 5B | Δ | ◎ | 0.9 nm | ◎ | Δ | Δ | Δ |
| Sample 6 | 5H | 100 | 5B | 5B | 5B | ◎ | ◎ | 0.9 nm | ◎ | Δ | Δ | Δ |
| Sample 7 | 5H | 100 | 5B | 5B | 5B | ◎ | ◎ | 0.9 nm | ◎ | Δ | Δ | Δ |
| Sample 8 | 5H | 60 | 5B | 5B | 5B | ◎ | ○ | 0.8 nm | ◎ | Δ | Δ | Δ |
| Sample 9 | 5H | 100 | 5B | 5B | 5B | ◎ | ◎ | 0.4 nm | ◎ | ○ | ○ | ○ |
| Sample 10 | 5H | 100 | 5B | 5B | 5B | ◎ | ◎ | 0.3 nm | ◎ | ◎ | ◎ | ◎ |
| Sample 11 | 5H | 60 | 5B | 5B | 5B | ◎ | ○ | 0.3 nm | ◎ | ◎ | ◎ | ◎ |
| Comparative Sample | 6H | <30 | 5B | 0B | 3B | ◎ | X | — | Δ | Δ | Δ | Δ |

The meanings of symbols shown in Table 2 are described below:

◎ : Excellent, ○: Good, Δ: Normal, X: Fail, NG: Not Good; or

◎ : no bubble observed, ○: few small bubbles, Δ: some big bubbles, X: lamination failure.

The testing methods performed in Table 2 are described below:

1. Pencil hardness test: using Mitsubishi special pencils for hardness test, with 750 g loading, performing sliding tests of pencils with different pencil hardness on the surface of the material; if there is no scratch, it is defined as the hardness of the surface (specification: JIS K5600).

2. Impact resistance with falling ball: using a 375 g stainless steel iron ball for free falling test to evaluate the height of impact resistance of the material surface (specification: defined by Applicant).

3. Initial adhesion/adhesion after water boiling: removing the 3M tape after performing the Cross Cut Test, and then judging the quality of adhesion according to the surface peeling condition of the material; in addition, boiling the material with boiling water and then performing the aforesaid tests to test the adhesion quality after water boiling (specification: ASTM D3002).

4. Wear-resistance of surface: nail scratch resistance under simulated use of touch panels (specification: defined by Applicant). The meanings of symbols shown in this column are: ⊚: Excellent (no scratch), ○: Good (very minor scratches, less than 3 scratches), Δ: Normal (minor scratches, with 3 to 5 scratches), X: Fail (serious scratches, more than 5 scratches).

5. Flexibility test: winding the material around a cylinder with a radius of 10 mm and then observing the change of appearance after flexure (Specification: ASTM D522). The meanings of symbols shown in this column are: ⊚: Excellent (no scratch), ○: Good (very minor scratches, less than 3 scratches), Δ: Normal (minor scratches, with 3 to 5 scratches), X: Fail (serious scratches, more than 5 scratches).

6. OCA bonding environmental test: after the material is bonded to the hard coating layer with OCA, performing various environmental tests on it, and then observing whether there are bubbles or delamination occurred in the bonding surface after the environmental tests (specification: defined by Applicant). The meanings of symbols shown in this column are: ⊚ No Bubble Observed, ○: Few Small Bubbles, Δ: Some Big Bubbles, X: Lamination Failure.

It can be seen from the above Table 1 and Table 2 that, the samples "Sample9", "Sample10" and "Sample11" produced according to the technology of the present invention have obtained the best test results. It is proved that, the polymer plastic front plate of the invention is suitable for bonding on the surface of automotive touch panels. By means of the addition of organic-inorganic high Glass Transition Temperature (Tg) UV oligomers and nano-scale flake-like inorganic oxides, a gas barrier hard coating layer with high surface dyne value (>44 dyne) can be formed on the adhesion surface of the plastic substrate. It not only has good ink printability and OCA adhesiveness, but also inhibits the diffusion of fugitive gas from polymer plastic front plates during high-temperature, high-temperature and high-humidity, high-low temperature (hot and cold) thermal shocks and other harsh automotive industry environmental tests, which is due to the fact that these nano-scale flaky inorganic oxides can form a discontinuously layered dispersed gas barrier layer in the hard coating layer. The gas can be avoided from entering the OCA layer, thereby solving the problems of bubbles and delamination after the environmental tests are performed. Wherein, the weight percentage of the organic-inorganic hybrid UV oligomer contained in the coating material of the hard coating layer is ranged between 50% and 70%, the weight percentage of the high Tg UV-curable resin additive is ranged between 30% and 50%, the weight percentage of the nano-scale flaky inorganic substances in the coating material of the hard coating layer is between 5% and 15%, and the weight percentage of the photo initiator is about 5% or so. By using the Applicant's above described polymer material formula, coating material formula and precision coating technology, the polymer plastic front plates in accordance with the samples "Sample9", "Sample10" and "Sample11" can be manufactured for passing the harsh automotive industry environmental tests.

While the present invention has been shown and described with reference to the preferred embodiments thereof and the illustrative drawings, it should not be considered as limited thereby. Various possible modifications and alterations can be conceived by persons skilled without departing from the scope and the spirit of the present invention.

What is claimed is:

1. A method for manufacturing a polymer plastic front plate, comprising:

providing a plastic substrate and a coating material; the plastic substrate having a bonding surface and an operation surface opposite to the bonding surface; said coating material including: a first weight percentage of organic-inorganic hybrid UV-curable oligomer, a second weight percentage of UV-curable resin additives with high glass transition temperature (Tg) value, a plurality of dispersed nano-scale flaky inorganic substances, and a photo initiator;

wherein, the process for providing the coating material comprises the following steps:

forming an inorganic layer on a carrier plate; wherein, the carrier plate is a glass carrier plate, and a release film is provided on a surface of the glass carrier plate; an inorganic material is plated on the release film by a vacuum sputtering process in order to form a whole piece of the inorganic layer on the surface of the release film;

detaching and breaking the inorganic layer into a plurality of tiny inorganic fragments; wherein the detaching and breaking step consists of vibrating the carrier plate in such a manner that, by merely vibrating the carrier plate, the inorganic layer is broken into the plurality of tiny inorganic fragments and then detached from the release film of the carrier plate, while the release film is remained on the surface of the carrier plate without being broken during the detaching and breaking step; wherein, the plurality of tiny inorganic fragments are the only objects being detached from the carrier plate during the detaching and breaking step;

smoothing and dispersing the plurality of tiny inorganic fragments in order to transform the plurality of tiny inorganic fragments into the plurality of dispersed nano-scale flaky inorganic substances; wherein, the plurality of tiny inorganic fragments obtained directly by the detaching and breaking step are mixed and stirred by a nano dispersion equipment, so that the plurality of tiny inorganic fragments can collide with each other to gradually smooth their sharp edges and also disperse them evenly and individually, so as to form the plurality of dispersed nano-scale flaky inorganic substances; and adding and mixing the plurality of dispersed nano-scale flaky inorganic substances into a solution of the organic-inorganic hybrid UV-curable oligomer, the UV-curable resin additive and the photo initiator to form the coating material;

applying the coating material onto the bonding surface of the plastic substrate; and curing the coating material to form a hard coating layer on the bonding surface of the plastic substrate; wherein, during the curing process, the plurality of dispersed nano-scale flaky inorganic substances will be affected by the gravity and hydrodynamics, and randomly dispersed and arranged along a horizontal direction in a parallel manner within the hard coating layer, such that the plurality of dispersed nano-scale flaky inorganic substances can form a discontinuously layered dispersed gas barrier layer in the hard coating layer.

2. The method for manufacturing a polymer plastic front plate of claim 1, further comprising:
providing a protective layer on the operation surface of the plastic substrate
printing an ink layer on the bonding surface of the plastic substrate;
applying an optical clear adhesive (OCA) on the bonding surface of the plastic substrate; and
bonding the bonding surface of the plastic substrate to a touch panel by means of the optical clear adhesive;
wherein the operation surface of the plastic substrate is for a user to touch and operate the touch panel.

3. The method for manufacturing a polymer plastic front plate of claim 2, wherein the organic-inorganic hybrid UV-curable oligomer includes a polyurethane resin and a sol-gel silica hybrid mixture.

4. The method for manufacturing a polymer plastic front plate of claim 3, wherein the glass transition temperature (Tg) value of the UV-curable resin additives is not less than 120° C.; in addition, the UV-curable resin additives contain at least one of the following: UV-curable oligomer with high glass transition temperature (high Tg UV oligomer) and UV-curable monomer with high glass transition temperature (high Tg UV monomer).

5. The method for manufacturing a polymer plastic front plate of claim 4, wherein the UV-curable oligomer with high glass transition temperature is polyurethane acrylate, which has a glass transition temperature (Tg) value not less than 120° C.; in addition, the UV-curable monomer with high glass transition temperature is Tris(2-hydroxy ethyl) isocyanuratetriacrylate (THEICTA), which has a glass transition temperature (Tg) value not less than 240° C.

6. The method for manufacturing a polymer plastic front plate of claim 5, wherein the nano-scale flaky inorganic substances are composed of at least one of the following materials: $SiO_2$, $Al_2O_3$, $Si_3N_4$, $SiO_xN_y$, and $AlO_xN_y$.

7. The method for manufacturing a polymer plastic front plate of claim 6, wherein each of the nano-scale flaky inorganic substances has a thickness (t), a longitudinal width (w1) and a lateral width (w2); wherein, the measuring directions of the thickness (t), the longitudinal width (w1) and the lateral width (w2) are perpendicular to each other, and w1≥w2≥t; wherein, the thickness (t) is between 0.1 nm and 50 nm, the longitudinal width (w1) is between 100 nm and 1000 nm, and the ratio of the lateral width to the longitudinal width (w2/w1) is between 0.01 and 1.

8. The method for manufacturing a polymer plastic front plate of claim 7, wherein 10 nm≤t≤30 nm, 300 nm≤w1≤800 nm, and 0.1≤(w2/w1)≤1.

9. The method for manufacturing a polymer plastic front plate of claim 8, wherein the value of the first weight percentage is ranged between 50% and 70%, the value of the second weight percentage is ranged between 30% and 50%, and the value of the weight percentage of the nano-scale flaky inorganic substances in the hard coating layer is between 5% and 15%.

10. The method for manufacturing a polymer plastic front plate of claim 9, wherein the plastic substrate is one of the following: polymethyl methacrylate (PMMA) plate, polycarbonate (PC) plate, PMMA/PC double-layer composite plate, and PMMA/PC/PMMA three-layer composite plate.

* * * * *